United States Patent [19]

Yamashita et al.

[11] Patent Number: 5,430,737
[45] Date of Patent: Jul. 4, 1995

[54] APPARATUS FOR TESTING FUNCTION OF INTEGRATED CIRCUIT

[75] Inventors: Eisaku Yamashita; Ryuuji Omura, both of Itami, Japan

[73] Assignee: Mitsubishi Denki Kabushiki Kaisha, Tokyo, Japan

[21] Appl. No.: 171,637

[22] Filed: Dec. 22, 1993

[30] Foreign Application Priority Data

Dec. 25, 1992 [JP] Japan ................... 4-346964

[51] Int. Cl.$^6$ .................................. G01R 31/28
[52] U.S. Cl. ............................. 371/25.1; 371/27
[58] Field of Search ............... 371/25, 27; 324/73.1

[56] References Cited

U.S. PATENT DOCUMENTS

| | | | |
|---|---|---|---|
| 4,271,515 | 6/1981 | Axtell et al. | 371/25 |
| 4,313,200 | 1/1982 | Nishiura | 371/25 |
| 4,497,056 | 1/1985 | Sugamori | 371/25 |
| 4,584,683 | 4/1986 | Shimizu et al. | 371/25 |
| 4,656,632 | 4/1987 | Jackson | 371/20 |
| 4,775,977 | 10/1988 | Dehara | 371/27 |
| 4,893,072 | 1/1990 | Matsumoto | 371/223 |
| 4,928,278 | 5/1990 | Otsuji et al. | 371/1 |
| 5,164,665 | 11/1992 | Yamashita et al. | 324/158 R |

FOREIGN PATENT DOCUMENTS

| | | |
|---|---|---|
| 63-140967 | 6/1988 | Japan . |
| 377079 | 4/1991 | Japan . |
| 3210480 | 9/1991 | Japan . |
| 0611544 | 1/1994 | Japan . |

Primary Examiner—Emanuel T. Voeltz
Assistant Examiner—Patrick J. Assouad
Attorney, Agent, or Firm—Leydig, Voit & Mayer

[57] ABSTRACT

An apparatus for testing the function of an IC that has a discrimination circuit for discriminating the result of a function test regardless of a change in the output timing of output data from an IC being tested. The discrimination circuit makes a nondefective determination if a discrimination time range from a starting point, a time from the transmission by a first timing generating circuit, to an end point, a time from a transmission by a second timing/generating circuit, includes a time region in which the output data from the IC and predicted data of an IC tester coincide with each other. A function test applying a high power supply voltage Vcc to the IC and a function test applying a low voltage Vcc can respectively be correctly performed to determine whether the subject IC is nondefective while eliminating the necessity of changing the timing data of the first and second timing generating circuits.

6 Claims, 10 Drawing Sheets

FIG. I

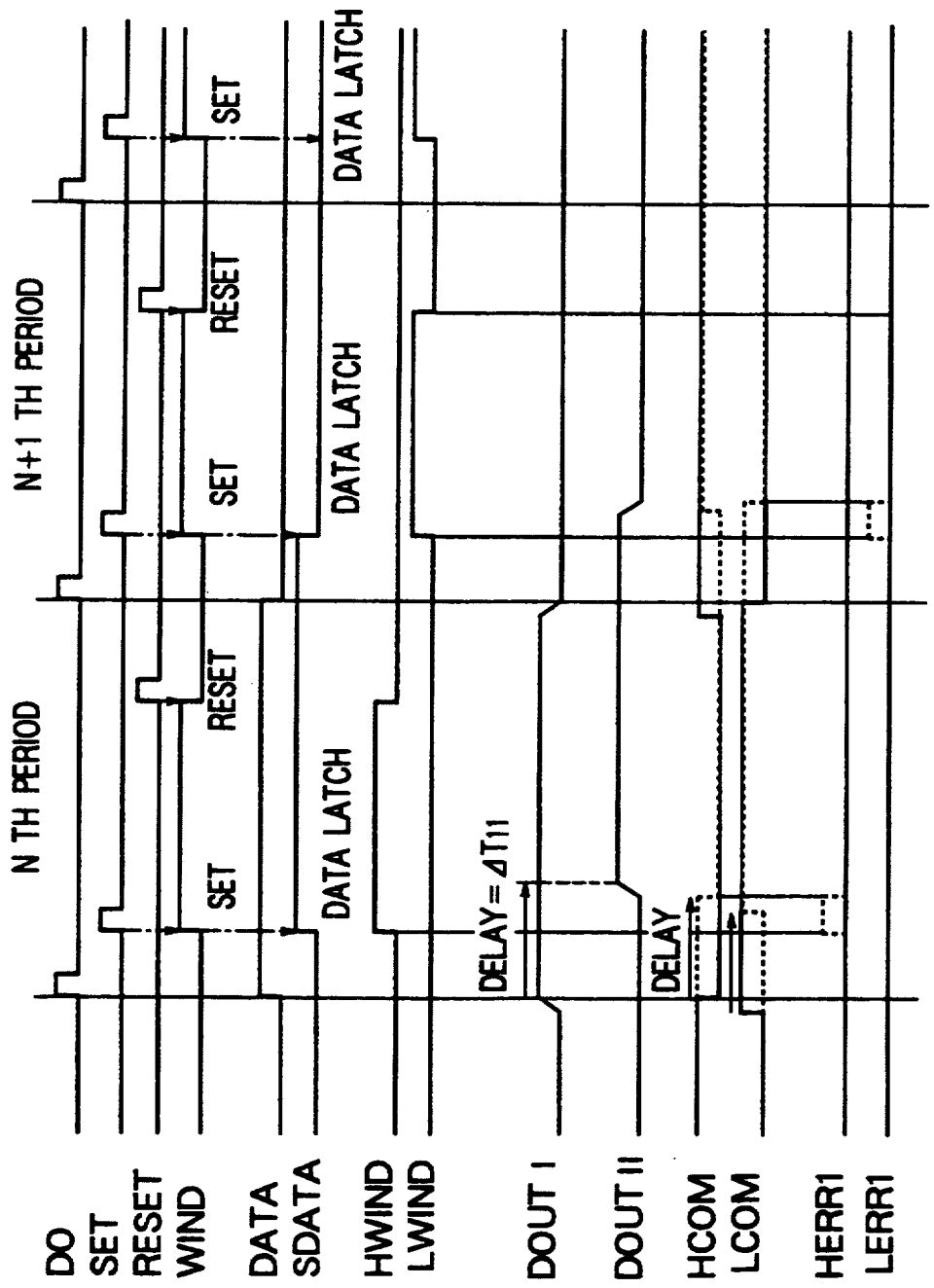

APPARATUS FOR TESTING FUNCTION OF INTEGRATED CIRCUIT

BACKGROUND OF THE INVENTION

This invention relates to a method and an apparatus for testing the function of an integrated circuit (hereinafter called a "IC").

FIG. 8 is a circuit diagram illustrating an internal discriminating circuit of a known function testing apparatus for testing the function of an IC. As illustrated in FIG. 8, reference numeral 9 designates an IC to be tested concerning its functions in the function test. When the function test is performed, the IC 9 is electrically connected to an internal discriminating circuit of the known function testing apparatus by a testing pin 14 so that the IC 9 is tested. FIG. 6 is a block diagram of the IC 9. The structure of the discriminating circuit of the known function testing apparatus will now be described, which comprises a reference signal generating unit 1 for generating a reference signal (hereinafter called a "DO") for the function testing apparatus, a start-timing signal generating circuit 2 (hereinafter called a "SET generating circuit") for generating a discrimination start-timing signal (hereinafter called a "SET"), a completion timing signal generating circuit 3 (hereinafter called a "RESET generating circuit") for generating a discrimination completion-timing signal (hereinafter called "RESET"), and a RS-flip-flop 4 for generating a discrimination range signal (hereinafter called "WIND") indicating a discrimination time range by using the timing signal SET generated by the SET generating circuit 2 and the completion-timing signal RESET generated by the RESET generating circuit 3. The discriminating circuit of the testing apparatus further comprises a test pattern memory 5 for storing test pattern data (hereinafter called "DATA") for switching between high level discrimination and low level discrimination, and a D-flip-flop 6 for generating a signal (hereinafter called "SDATA") by latching the test pattern data DATA transmitted from the test pattern memory 5 by the timing signal SET from the SET generating circuit 2. The discriminating circuit of the testing apparatus still further comprises an AND gate 7 for generating the logical product signal (hereinafter called "HWIND") indicating the logical product of the discrimination range signal WIND supplied from the RS-flip-flop 4 and the signal SDATA supplied from the D-flip-flop 6, and another AND gate 8 for generating a logical product signal (hereinafter called "LWIND") indicating the logical product of the discrimination range signal WIND and inverse signal $\overline{SDATA}$ of SDATA.

Reference numeral 10 designates a high-level comparative voltage generating circuit for receiving a predicted high-level comparative voltage data transmitted from a control circuit 19 which controls the function testing apparatus and supplying a high-level comparative voltage corresponding to the data from the control circuit 9, 11 is a potential comparison circuit for generating a high-level comparative signal (hereinafter called "HCOM") by comparing a potential of a output voltage (hereinafter called "DOUT") supplied from the IC 9 to be tested with the potential of the high level comparative voltage, 12 is a low-level comparative voltage generating circuit for receiving predicted low-level comparative voltage data transmitted from the control circuit 19 and supplying a low level comparative voltage corresponding to the transmitted data from the control circuit 19, 13 is a potential comparison circuit for generating a low-level comparative signal (hereinafter called "LCOM") by comparing the potential of the output voltage DOUT from the IC 9 to be tested with the potential of the low-level comparative voltage, 15 is an AND gate for generating a high-level defective signal (hereinafter called "HERR 1") which is the logical product of the comparative signal HCOM supplied from the potential comparison circuit 11 and the logical product signal HWIND supplied from the AND gate 7, 16 is an AND gate for generating a low-level defective signal (hereinafter called "LERR 1") which is the logical product of the comparative signal LCOM supplied from the potential comparison circuit 13 and the logical product signal LWIND supplied from the AND gate 8, 17 is a latch circuit for latching the signal HERR 1, 18 is a latch circuit for latching the signal LERR 1, 20 is a signal line for transmitting the latched signal HERR 1 latched by the latch circuit 17 to the control circuit 19, 21 is also a signal line for transmitting the latched signal LERR 1 latched by the latch circuit 18 to the control unit 19, and 22 is a signal line for transmitting set data supplied from the control circuit 19 to the SET generating circuit 2, the RESET generating circuit 3, the test pattern memory 5 and the voltage generating circuits 10 and 12.

The operation of the discriminating circuit of the known IC function testing apparatus shown in FIG. 8 will now be described. A process to be performed before the function test is carried out will now be described. The control circuit 19, through the signal line 22, transmits to the SET generating circuit 2 the start-timing data with which the RS-flip-flop 4 supplies the discrimination range signal WIND, transmits to the RESET generating circuit 3 the completion timing data with which the RS-flip-flop 4 stops supplying the discrimination range signal WIND, transmits to the test pattern memory 5 all test pattern data DATA required to test the functions, transmits to the voltage generating circuit 10 the predicted high-level comparative voltage data, and transmits to the voltage generating circuit 12 the predicted low-level comparative voltage data.

A process to be performed during the function test will now be described. FIG. 9 is a timing chart of the operation timing of the discrimination circuit of the IC function testing apparatus. The SET generating circuit 2 receives the reference signal DO from the reference signal generating unit 1, delays the reference signal DO in a time interval corresponding to quantity of the start-timing data transmitted from the control circuit 19 and generates the discrimination start-timing signal SET. The RESET generating circuit 3 receives the reference signal DO supplied from the reference signal generating unit 1, delays the reference signal DO in a time interval corresponding to the quantity of the completion timing data transmitted from the control circuit 19 and supplies the discrimination completion timing signal RESET. The RS-flip-flop 4 receives the timing signals SET and RESET and generates the discrimination range signal WIND. The discrimination start timing signal SET serves as the set input for the RS-flip-flop 4, and the discrimination completion timing signal RESET serves as the reset input for the RS-flip-flop 4. That is, the discrimination range signal WIND becomes a high level signal during a period from the rise time of the SET to the rise time of the RESET as shown in FIG. 9. The test pattern memory 5 triggers the reference signal DO as to sequentially supply the test pattern data DATA. The D-flip-flop 6 receives the test pattern data DATA transmitted from the test pattern memory 5 and the discrimination start timing signal SET as to supply the signal SDATA. The test pattern data DATA is a data input, and the timing signal SET is a clock input. Therefore, the signal SDATA is generated by latching the test pattern data DATA at the rise time of the timing signal SET. As a result, information of the signal SDATA is held to the rise time of the next SET, exceeding the period. When the level of the discrimination range signal WIND is high while the level of SDATA is high as shown in the N th period in FIG. 9, the AND gate 7 receives the discrimination range signal WIND and outputs the logical product signal HWIND at a high level. Therefore, a high-level discrimination is performed in the period in which the level of the logical product signal HWIND is high. When the level of the discrimination range signal WIND is high during the period in which the level of SDATA is low as shown in the N+1th period in FIG. 9, the AND gate 8 receives the discrimination range signal WIND and outputs the logical product signal LWIND at the high level. Therefore, a low-level discrimination is performed in the period in which the level of the logical product signal LWIND is high.

The function test evaluation is defined such that a defective high level discrimination is made when the potential of the output voltage DOUT from the IC 9 becomes higher than the high-level comparative voltage in the high level discrimination period, and a defective low level discrimination is made when the potential of the output voltage DOUT from the IC 9 becomes lower than the low-level comparative voltage in the low level discrimination period. The voltage generating circuit 10 generates a high-level comparative voltage corresponding to the predicted comparative high-level voltage data supplied from the control circuit 19. The voltage comparison circuit 11 supplies the comparative signal HCOM by receiving the high-level comparative voltage at a positive comparison terminal thereof and the output voltage DOUT from the IC 9 at a negative comparison terminal thereof and compares the high-level comparative voltage and the output voltage DOUT from the IC 9. The level of the comparative signal HCOM becomes high when the potential of the output voltage DOUT from the IC 9 is higher than that of the high-level comparative voltage, on the other hand, the same becomes low in a case contrary to this. The AND gate 15 receives the logical product signal HWIND transmitted from the AND gate 7 and the comparative signal HCOM as to generate the signal HERR 1. As shown in the Nth period in FIG. 9, the AND gate 15 transmits high level HERR 1 when the level of the comparative signal HCOM is high during the period in which the logical product signal HWIND is high. Therefore, the AND gate 15 notifies that there was a time period, in which the defective high level discrimination was made, during the high level discrimination period, and the discrimination was made in accordance with the result of the comparison with the high level voltage made by the voltage comparison circuit 11. The latch circuit 17 latches HERR 1 as to transmit, to the control circuit 19 through the signal line 50, information denoting that the high-level defective discrimination has been made.

The voltage generating circuit 12 generates the low-level comparative voltage that corresponds to the predicted comparative low-level voltage data transmitted from the control circuit 19. The voltage comparison circuit 13 receives the output voltage DOUT of the IC 9 at the positive comparison terminal thereof and the low-level comparative voltage at the negative comparison terminal thereof so as to compare the low-level comparative voltage and the output voltage DOUT of the IC 9 to supply the comparative signal LCOM. The level of the comparative signal LCOM becomes high when the output voltage DOUT from the IC 9 is lower than the low-level comparative voltage. The same becomes low in the contrary case. According to the illustrated example of the output, the AND gate 16 transmits high level LERR 1 when the level of the comparative signal LCOM is high during the period in which the logical product signal LWIND is high as shown in the N+1th period in FIG. 9. That is, the AND gate 16 notifies that a time period, in which the defective low level discrimination was made, was present during the low level discrimination period, the discrimination being made in accordance with the result of the comparison of the low level voltage made by the voltage comparison circuit 13. The latch circuit 18 latches LERR 1 as to transmit, to the control circuit 19 through the signal line 21, information denoting that the low-level defective discrimination has been made. As a result, the information denoting that the high-level defective discrimination has been made and the information denoting that the low-level defective discrimination has been made are used by the control circuit 19 to recognize the result of the function test to which the IC 9 has been subjected whether the result was satisfactory or defective.

When the RESET is set up to exceed the period as shown in FIG. 10, SDATA latched at the rise time of the discrimination start timing signal SET in the N th period is held to the rise time of the discrimination start timing signal SET at the N+1th period. The high level period of the discrimination range signal WIND is from the rise timing of the discrimination start timing signal SET in the N th period to the rise timing of the discrimination completion timing signal RESET in the N+1th period. The AND gate 7 transmits the logical product signal HWIND exceeding two periods in accordance with SDATA and the discrimination range signal WIND. As a result, the discrimination circuit of the IC function testing apparatus can carry out the high level discrimination exceeding the two periods. Also, the AND gate 8 transmits the logical product signal LWIND exceeding the two periods as a result of a similar arrangement as shown from the N+1th period to the N+2th period. Therefore, the discrimination circuit of the IC function testing apparatus is able to discriminate the low level exceeding the two periods.

In the trend of lowering the potential of the integrated circuits, tests have been performed to realize the electrical characteristics of the integrated circuits at low voltage levels. Therefore, function tests are sometimes performed in such a manner that low potential voltage is applied to a power supply voltage Vcc of the IC. However, the change of the Vcc results in the electrical characteristics of the IC 9 changing the output timing of the output data DOUT from the IC 9 as shown in FIG. 7. That is, the output timing for the output voltage DOUT is delayed for ΔT when the Vcc is a low voltage as compared with a case where it is a high voltage. Since the known IC discriminating circuit for performing the function test has been constituted as described above, a problem arises in that data for setting the timing for the SET generating circuit 2 and that for the RESET generating circuit 3 must be changed to change the discrimination region according to the change in the output timing of the output data DOUT from the IC 9 between the two cases where the function test is performed by applying a high voltage Vcc and applying a low voltage Vcc.

Output data is defined as DOUT 1 when the function test is performed while applying a high a voltage Vcc of the IC 9 to be tested as shown in the N th period in FIG. 11. In this case, the region, in which the level of HWIND is high, that is, the high level discrimination region, includes no time region in which the high level comparative signal HCOM is high. Therefore, the high level voltage comparison performed by the voltage comparison circuit 11 is results in an output voltage DOUT 1 from the IC 9 to be tested that does not exceed the high level comparative voltage. As a result, no high level HERR 1 is transmitted, and therefore no time region is present in which the defective high region is discriminated. However, when low voltage is applied as the power supply voltage Vcc to perform the function test, the output voltage DOUT II from the IC 9 to be tested is delayed for $\Delta T_{11}$ as shown in FIG. 11. It leads to a fact that the time region in which the level of HCOM is high is delayed. As a result, the high level discrimination region inevitably includes the time region in which the level of the high level comparative signal HCOM is high. As a result, HERR 1 having a high level is transmitted in the above time region as shown by a dashed line, and therefore a defective high level is undesirably indicated.

When the function test is performed while applying high voltage, no time region, in which the high level LCOM is transmitted, is present in the low level discrimination region as shown in the N+1th period shown in FIG. 11. Therefore, no high level LERR 1 is transmitted, and therefore no time region is present in which the defective low level discrimination is made. However, when the test is performed by applying low voltage, the output voltage DOUT II from the IC 9 is undesirably delayed for $\Delta T_{11}$. In this case a time region is present, in which high level LCOM is transmitted in the low level discrimination region. As a result, the high level LERR 1 is transmitted in the above time region as designated by a dashed line, and therefore the defective low level is undesirably discriminated.

SUMMARY OF THE INVENTION

The present invention is directed to overcome the foregoing problems and therefore an object of the present invention is to provide an IC function testing apparatus comprising a discrimination circuit which is capable of determining the result of a function test regardless of a change in the output timing of output data DOUT from the IC.

In order to achieve the foregoing object, an apparatus of the present invention for testing the function of an IC comprises a test pin which electrically contacts an IC to be tested; and a discrimination circuit comprising: a first timing-signal generating portion for transmitting a discrimination start timing signal serving as a start point of a discrimination time range,; a second timing-signal generating portion for transmitting a discrimination completion timing signal serving as an end point of the discrimination time range; a test pattern transmitting portion that stores a test pattern and transmits the test pattern in response to the discrimination start timing signal supplied from the first timing-signal generating portion; a voltage comparison and discrimination portion that subjects to a comparison and determines the output voltage from the IC to be tested and predicted voltage data set for testing the function for each test pattern in the discrimination time range in accordance with the test pattern to transmit a nondefective discrimination signal in a time region in which the output voltage and the predicted voltage data coincide with each other in the discrimination time range; a discrimination signal transmitting portion for transmitting, for each test pattern and in accordance with the test pattern, a discrimination signal, the start point of which is the discrimination start timing signal and the end point of which is the output timing of the nondefective discrimination signal transmitted from the voltage comparison and discrimination portion; and a discrimination information transmitting portion that latches the discrimination signal at the discrimination completion timing, which is the end point of the discrimination time range, to transmit nondefective/defective discrimination information while making a nondefective discrimination if the discrimination time range includes the time region in which the nondefective discrimination signal is transmitted and in which the output voltage from the IC to be tested and the predicted data coincide with each other.

According to the present invention, a determination is that an IC is nondefective if a discrimination time range, which starts at a timing transmitted from the first timing generating circuit and ends at the timing transmitted from the second timing generating circuit, includes a time region in which output data DOUT from the IC and predicted voltage data coincide with each other so that the function test can be performed regardless of any change in the output timing of the output data DOUT from the IC.

BRIEF DESCRIPTION OF THE DRAWINGS

FIG. 11 is a timing chart which illustrates the high level discrimination operation according to the known example performed with low voltage.

DESCRIPTION OF THE PREFERRED EMBODIMENT

Figure 1:
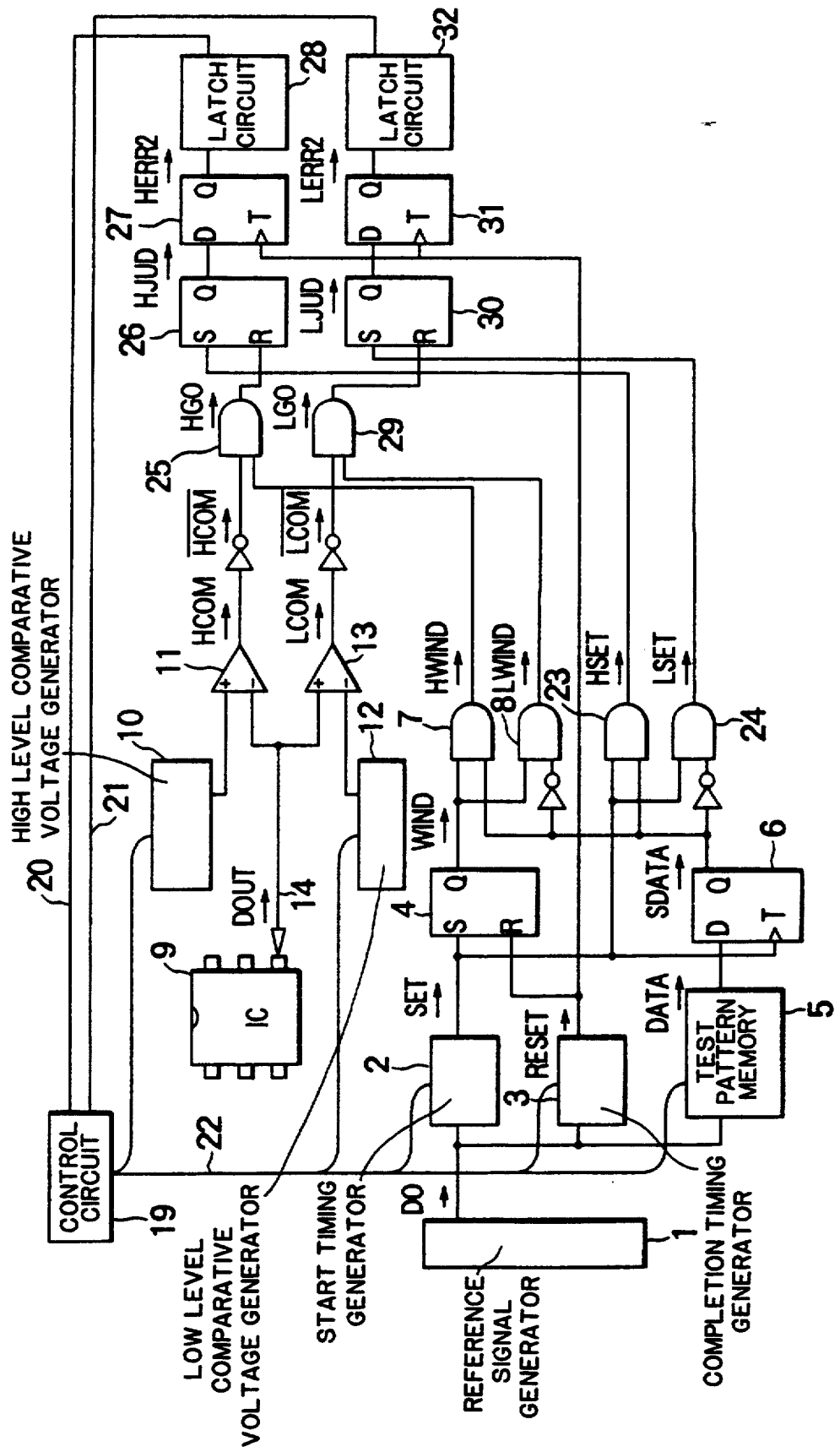
FIG. 1 is a circuit diagram which illustrates an embodiment of the present invention.
Figure 6:
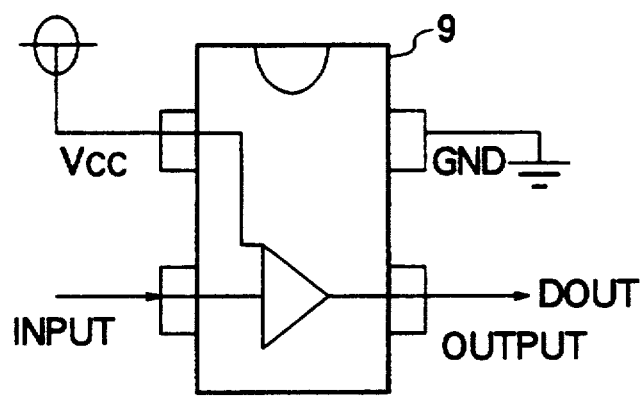
FIG. 6 is a block diagram which illustrates an IC to be tested.
Figure 7:
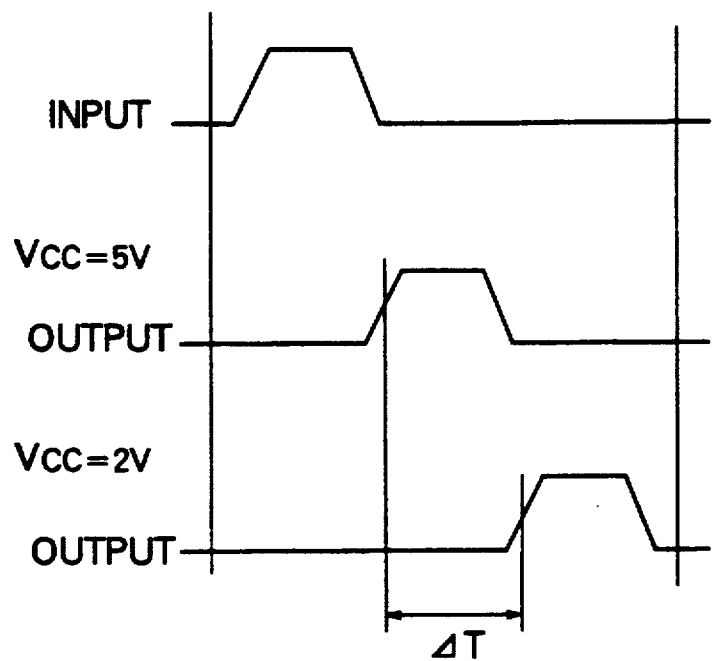
FIG. 7 is a timing chart which illustrates a change in the output timing from an IC occurring due to a change in the power supply voltage.
Figure 8:
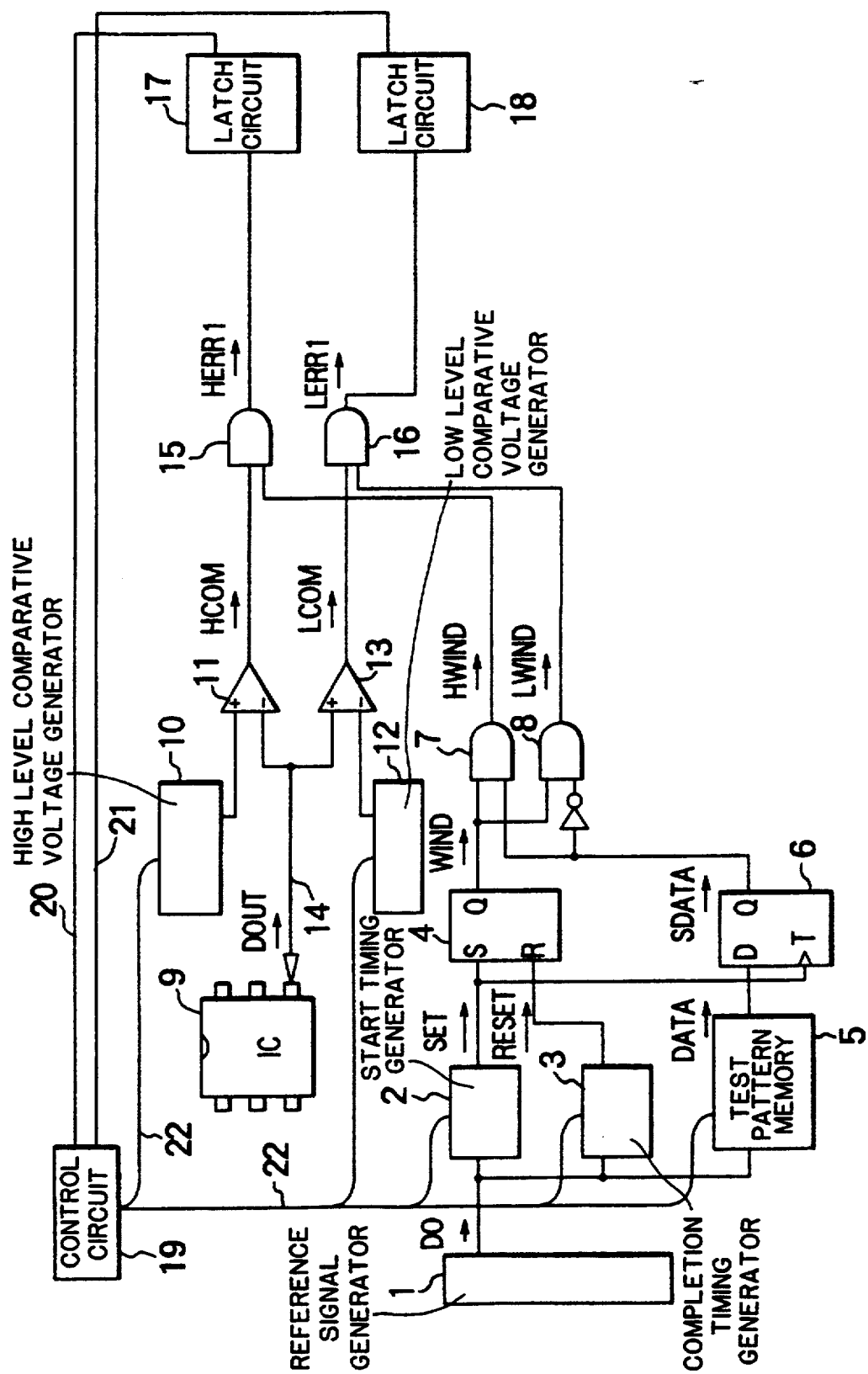
FIG. 8 is a circuit diagram which illustrates a known example.
Figure 9:
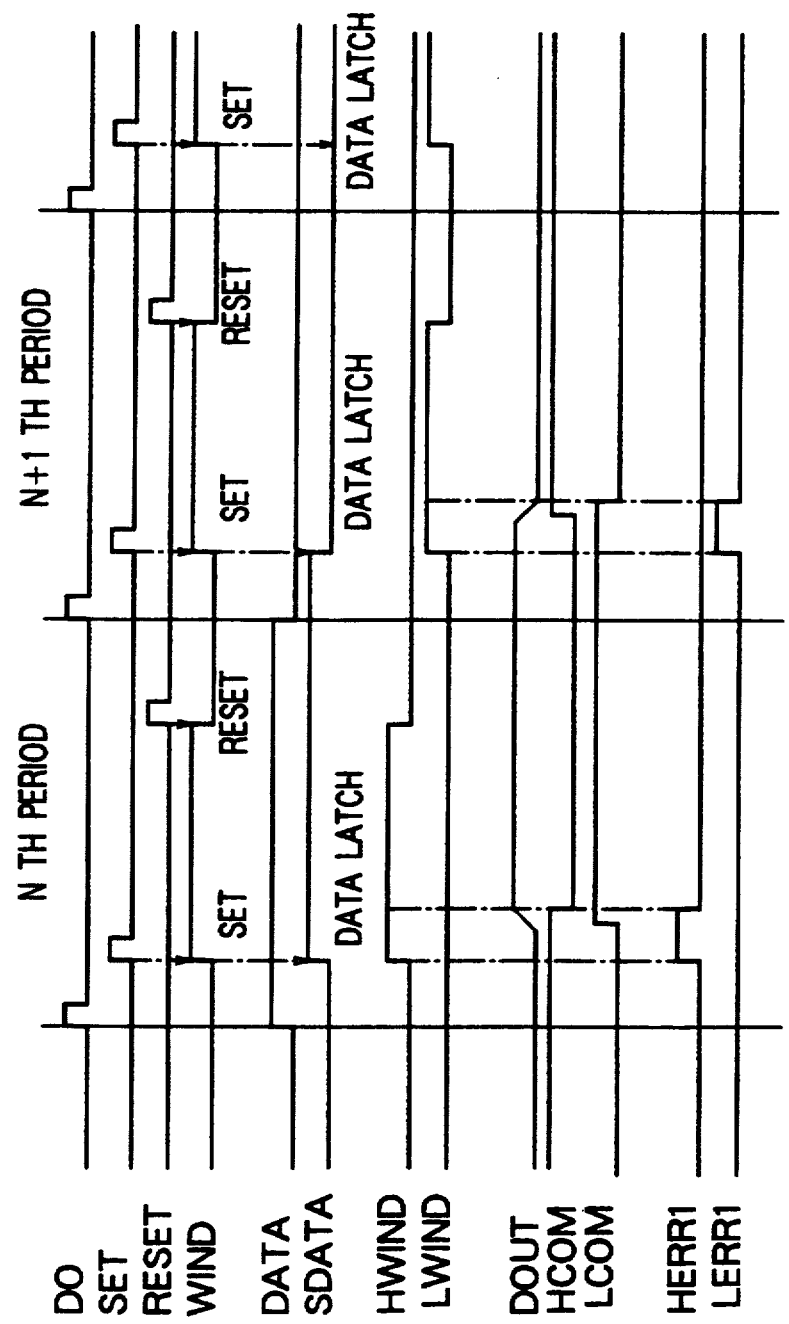
FIG. 9 is a timing chart which illustrates the discrimination operation of the known example.
Figure 10:
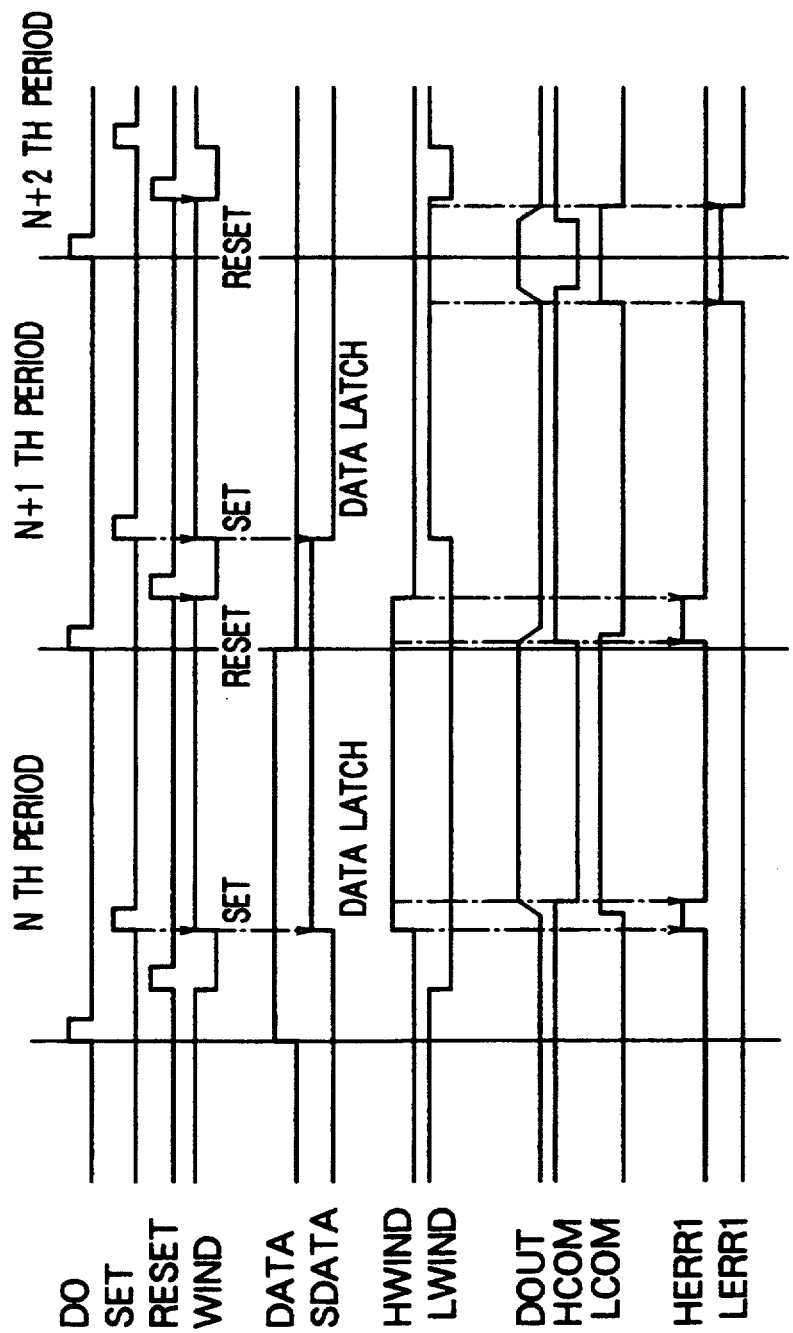
FIG. 10 is a timing chart which illustrates the discrimination operation of the known example.

FIG. 1 is a circuit diagram which illustrates an embodiment of an IC function testing apparatus according to the present invention. Similarly to the known apparatus, the IC 9 to be tested is, by a test pin 14, electrically connected to the internal discriminating circuit of the function testing apparatus shown in FIG. 1. The test pin 14 provides an electrical connection between the output pins of the IC 9 under test, as shown in more detail in FIG. 6, and the comparison circuits 11 and 12. Since elements to 14 and 19 to 22 are the same as those of the known function testing apparatus, the same reference numerals are given and their descriptions are omitted here. As illustrated in FIG. 1, reference numeral 23 designates an AND gate that receives the discrimination start timing signal SET supplied from the SET generating circuit 2 serving as a first timing signal generating portion and SDATA supplied from the D-flip-flop 6 and transmits a high-level discrimination start timing signal (hereinafter called "HSET") which is a logical product signal of SET and SDATA, 24 is an AND gate for transmitting a low level discrimination start timing signal (hereinafter called "LSET") which is a logical product signal of the timing signal SET and inverse signal $\overline{SDATA}$ of SDATA, 25 is an AND gate that receives the output voltage DOUT from the IC 9, the inverse signal $\overline{HCOM}$ of the high level comparative signal HCOM transmitted from the potential comparison circuit and HWIND transmitted from the AND gate 7 and transmits a nondefective high level discrimination signal (hereinafter called "HGO") which is the logical product of HCOM and HWIND, 26 is a RS-flip-flop of a discrimination signal transmitting portion for transmitting a high-level discrimination signal (hereinafter called "HJUD") in accordance with the nondefective high level discrimination signal HGO and the high level discrimination start timing signal HSET transmitted from the AND gate 23, 27 is a D-flip-flop that latches the high level discrimination signal HJUD with the discrimination completion timing signal RESET supplied from the RESET generating circuit 3 serving as a second timing signal generating portion and transmits a defective high level discrimination signal (hereinafter called "HERR 2"), and 28 is a latch circuit that latches HERR 2 and transmits defective/nondefective discrimination information to the control circuit 19 through the signal line 20. Reference numeral 29 designates an AND gate for transmitting a nondefective low level discrimination signal (hereinafter called "LGO") which is the logical product of an inversion signal, $\overline{LCOM}$, of the low level comparative signal LCOM transmitted from the potential comparison circuit 13 and the logical product signal LWIND transmitted from the AND gate 8, 30 is a RS-flip-flop for transmitting a low level discrimination signal (hereinafter called "LJUD") in accordance with the nondefective low level discrimination signal LGO and the logical product signal LSET transmitted from the AND gate 24, 31 is a D-flip-flop that latches the low level discrimination signal LJUD with the discrimination completion timing signal RESET transmitted from the RESET generating circuit 3 and transmits a defective low level discrimination signal (hereinafter called "LERR 2"), and 32 is a latch circuit that latches the defective low level discrimination signal LERR 2 and transmits nondefective/defective discrimination information to the control circuit 19 through the signal line 21. The AND gates 7, 8, the voltage generating circuits 10, 12, the potential comparison circuits 77, 13, the AND gates 25 and 29 compose a voltage comparison and discriminating portion that compares the output voltage DOUT from the IC 9 with the predicted voltage data to make a determination for each of the high and low levels in accordance with the test pattern data and transmits the nondefective high level discrimination signal HGO and the nondefective low level discrimination signal LGO in the time region in which the output voltage DOUT and the predicted voltage data coincide with each other. The AND gates 23, 24, the RS-flip-flops 26 and 30 compose a discrimination signal transmitting portion for transmitting the high level discrimination signal HJUD and the low level discrimination signal LJUD for each of the high and low levels in accordance with the test pattern data. The D-flip-flops 27, 31, the latch circuits 28 and 32 compose a discrimination information transmitting portion for transmitting nondefective/defective determination.

The control circuit 19 receives as inputs the latched signals from the two latch circuits 28 and 32 via signal lines 20 and 21, respectively. The control circuit 19 provides output signals to the start timing signal generating 2, the completion timing signal generating circuit 3, the test pattern memory 5 and the high and low level comparative voltage generating circuits 10 and 12. The signals sent to circuits 2 and 3 create a window of time, namely, the discrimination range. The test pattern memory 5 is sent all test pattern data required to test the functions of the IC 9. The high and low voltage generating circuits 10 and 12 receive the predicted high and low level voltages.

The operation of the embodiment of the present invention shown in FIG. 1 will now be described. First, the process previous to performing the function test is performed similarly to the known example. Since the previous process is the same as those of the known example, its description is omitted here. Similarly to the known example, the SET generating circuit 2 generates the discrimination start timing signal SET, and the RESET generating circuit 3 generates the discrimination completion timing signal RESET. The D-flip-flop 6 supplies the signal SDATA generated by latching the test pattern data DATA supplied from the test pattern memory 5 at the rise time of the discrimination start timing signal SET. The D-flip-flop and the test pattern memory 5 compose a test pattern transmitting portion. The AND gate 7 receives the signal SDATA and the discrimination range signal WIND supplied from the RS-flip-flop 4 and generates the logical production signal HWIND indicating the high level discrimination time range. The AND gate 8 receives the inversion signal $\overline{SDATA}$ of SDATA and the discrimination range signal WIND and transmits the logical product signal LWIND. The potential comparison circuit 11 receives at a positive comparison terminal thereof the high level comparative voltage generated by the voltage generating circuit 10 according to "the predicted comparative high-level voltage data supplied from the control circuit 19 and receives at the negative comparison terminal thereof the output voltage DOUT from the IC 9 and compares the potential of the high level comparative voltage and that of the output voltage DOUT from the IC 9 and generates the comparative signal HCOM. The potential comparison circuit 13, at the positive terminal thereof, receives the output voltage DOUT from the IC 9, and it receives, at the negative terminal thereof, the low level comparative voltage generated by the voltage generating circuit 12 according to the predicted comparative low-level voltage data supplied from the control circuit 19 and compares the potential of DOUT and the low level comparative voltage and generates the comparison signal LCOM.

Figure 2:
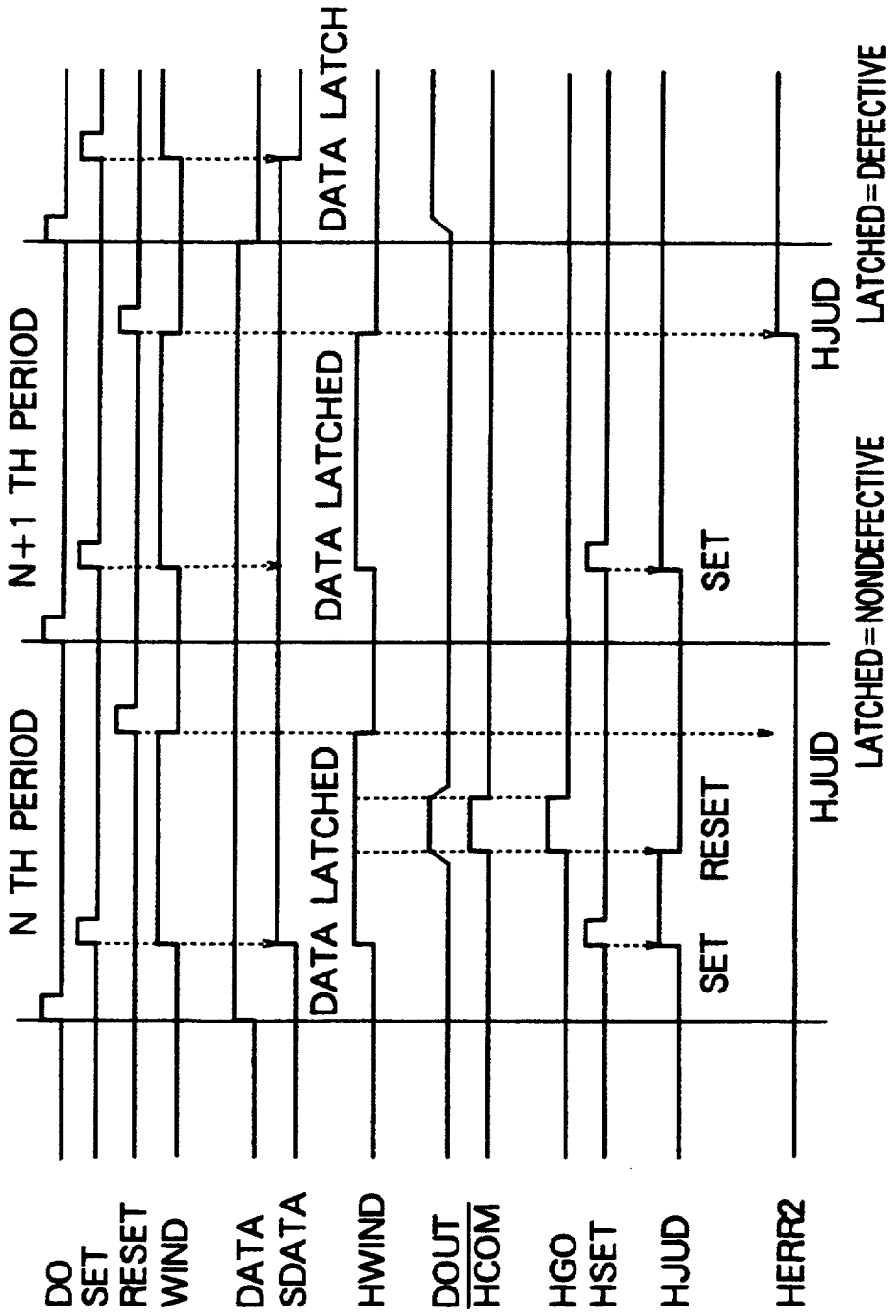
FIG. 2 is a timing chart of a high level discrimination operation according to an embodiment of the present invention.

The high level discrimination is performed as follows. FIG. 2 is a timing chart which illustrates the operation timing of an example of the high level discrimination. In a case shown in FIG. 2 in which the level of SET is high while the level of SDATA generated by latching the test pattern data DATA at the rise time of the discrimination start timing signal SET is high, the AND gate 23 receives the timing signal SET and transmits the logical product signal HSET of SET and SDATA. The AND gate 25 receives $\overline{\text{HCOM}}$, which is the inversion signal of the comparative signal HCOM, and HWIND supplied from the AND gate 7 and transmits the nondefective discrimination signal HGO which is the logical product of the $\overline{\text{HCOM}}$ and HWIND. When the level of $\overline{\text{HCOM}}$ is high in the period in which the level of the logical product signal HWIND is high as shown in the N th period shown in FIG. 2, the AND gate 25 transmits high level nondefective signal HGO. When the level of the $\overline{\text{HCOM}}$ does not become high at all in the period in which the level of the logical product signal HWIND is high as shown in the N+1th period in FIG. 2, the AND gate 25 maintains the low level of the nondefective discrimination signal HGO. The RS-flip-flop 26 receives the logical product signal HSET supplied from the AND gate 23 as the set input and receives the nondefective discrimination signal HGO as the reset input and transmits the high level discrimination signal HJUD. Therefore, the high level of the high level discrimination signal HJUD is maintained from the timing at which the high level HSET is received to the timing at which the high level nondefective signal HGO is received. The D-flip-flop 27 receives the high level discrimination signal HJUD and the discrimination completion timing signal RESET supplied from the RESET generating circuit 3 and transmits the defective high level discrimination signal HERR 2. The high level discrimination signal HJUD serves as a data input for the D-flip-flop 27, and the discrimination completion timing signal RESET serves as a clock input for the D-flip-flop 27. Therefore, the defective high level discrimination signal HERR 2 is a signal generated by latching the high level discrimination signal HJUD at the rise time of RESET. When the level of HJUD is low at the timing at which the level of RESET becomes high, the D-flip-flop 27 transmits the low level HERR 2 as shown in the N th period in FIG. 2. That is, it indicates that the time period in which a nondefective high level discrimination has been made in accordance with the high level voltage comparison performed by the voltage comparison circuit 11 was present in the high level discrimination period. When the level of HJUD is high at the rise time of RESET as shown in the N+1th period, the D-flip-flop 27 transmits a high level HERR 2. That is, it indicates that the high level discrimination period does not include the time region in which the nondefective high level has been discriminated in accordance with the result of the high level voltage comparison performed by the voltage comparison circuit 11. As a result, the fact that the defective high level discrimination has been made is indicated. The latch circuit 28 latches HERR 2 and transmits, to the control circuit 19 through the signal line 20 information indicating the result of the nondefective/defective determination.

Figure 3:
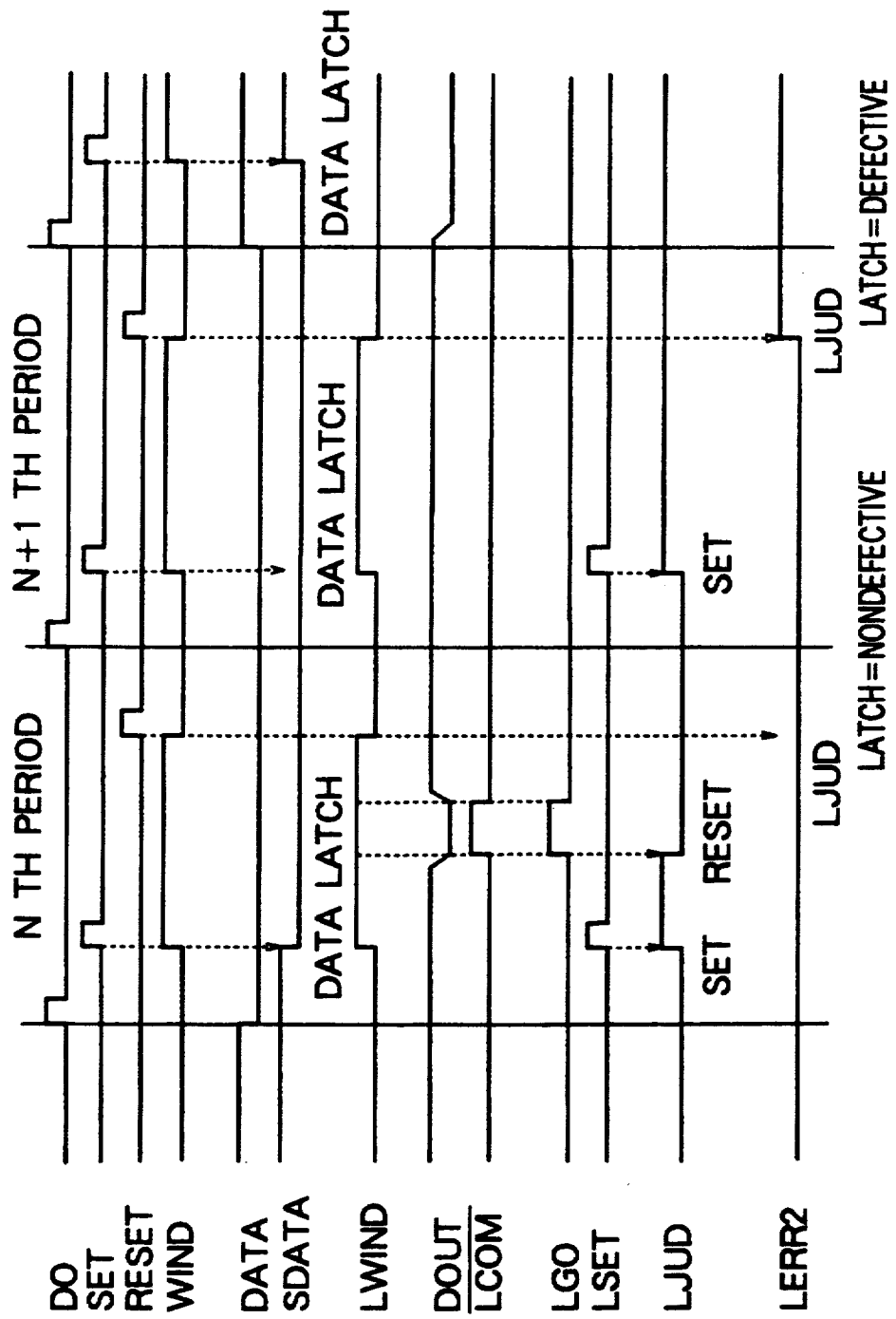
FIG. 3 is a timing chart of a low level discrimination operation according to an embodiment of the present invention.

The low level discrimination is performed as follows. FIG. 3 is a timing chart of the operation of the low level discrimination. When the level of the discrimination start timing signal SET is high in the period in which the level of SDATA is low, the AND gate 24 receives the timing signal SET and transmits the logical product signal LSET. The AND gate 29 receives the $\overline{\text{LCOM}}$, which is the inversion signal of the comparative signal LCOM, and the logical product signal LWIND and transmits the nondefective discrimination signal LGO which is the logical product of $\overline{\text{LCOM}}$ and LWIND. When the level of the $\overline{\text{LCOM}}$ is high in the period in which the level of the logical product signal LWIND is high as shown in the N th period in FIG. 3, the AND gate 29 transmits the high level nondefective discrimination signal LGO. When the level of the LCOM does not become high at all in the period in which the logical product signal LWIND is high as shown in the N+1th period in FIG. 3, the AND gate 29 maintains the nondefective discrimination signal LGO at the low level. The RS-flip-flop 30 receives the nondefective discrimination signal LGO and LSET and transmits the low level discrimination signal LJUD. The nondefective discrimination signal LSET serves as the set input for the RS-flip-flop 30, and LGO serves as the reset input for the RS-flip-flop 30. Therefore, the low level discrimination signal LJUD is maintained at the high level from the timing at which the high level LSET is received to the timing at which the high level LGO is received. The D-flip-flop 31 receives the low level discrimination signal LJUD and the discrimination completion timing signal RESET supplied from the RESET generating circuit 3 and transmits the defective low level discrimination signal LERR 2. The low level discrimination signal LJUD serves as the data input for the D-flip-flop 31, and the discrimination completion timing signal RESET serves as the clock input for the D-flip-flop 31. Therefore, the defective low level discrimination signal LERR 2 is a signal latched at the rise time of the RESET. When the level of LJUD is low at the timing at which the level of RESET becomes high as shown in the N th period in FIG. 3, the D-flip-flop 31 transmits the low level LERR 2. That is, it is indicated that the time period, which was determined to be a nondefective low level, was present in the low level discrimination period in accordance with the result of the comparison of the high level voltage performed by the voltage comparison circuit 13. When the level of the low level discrimination signal LJUD is high at the rise time of RESET as shown at the N+1th period in FIG. 3, the D-flip-flop 31 transmits the high level LERR 2. That is, it is indicated that the low level discrimination period does not include the time period in which the nondefective low level has been discriminated in accordance with the result of the comparison of the low level voltage performed by the voltage comparison circuit 13. Namely, the fact that defective low level test has been determined is indicated. The latch circuit 32 latches LERR 2 and transmits information indicating the result of the nondefective/defective low level determination to the control circuit 19 through the signal line 21. As a result, the control circuit 19 is able to recognize the result of the function test whether the result was satisfactry or defective in accordance with the information indicating the result of the defective high level discrimination and that of the defective low level discrimination.

Figure 4:
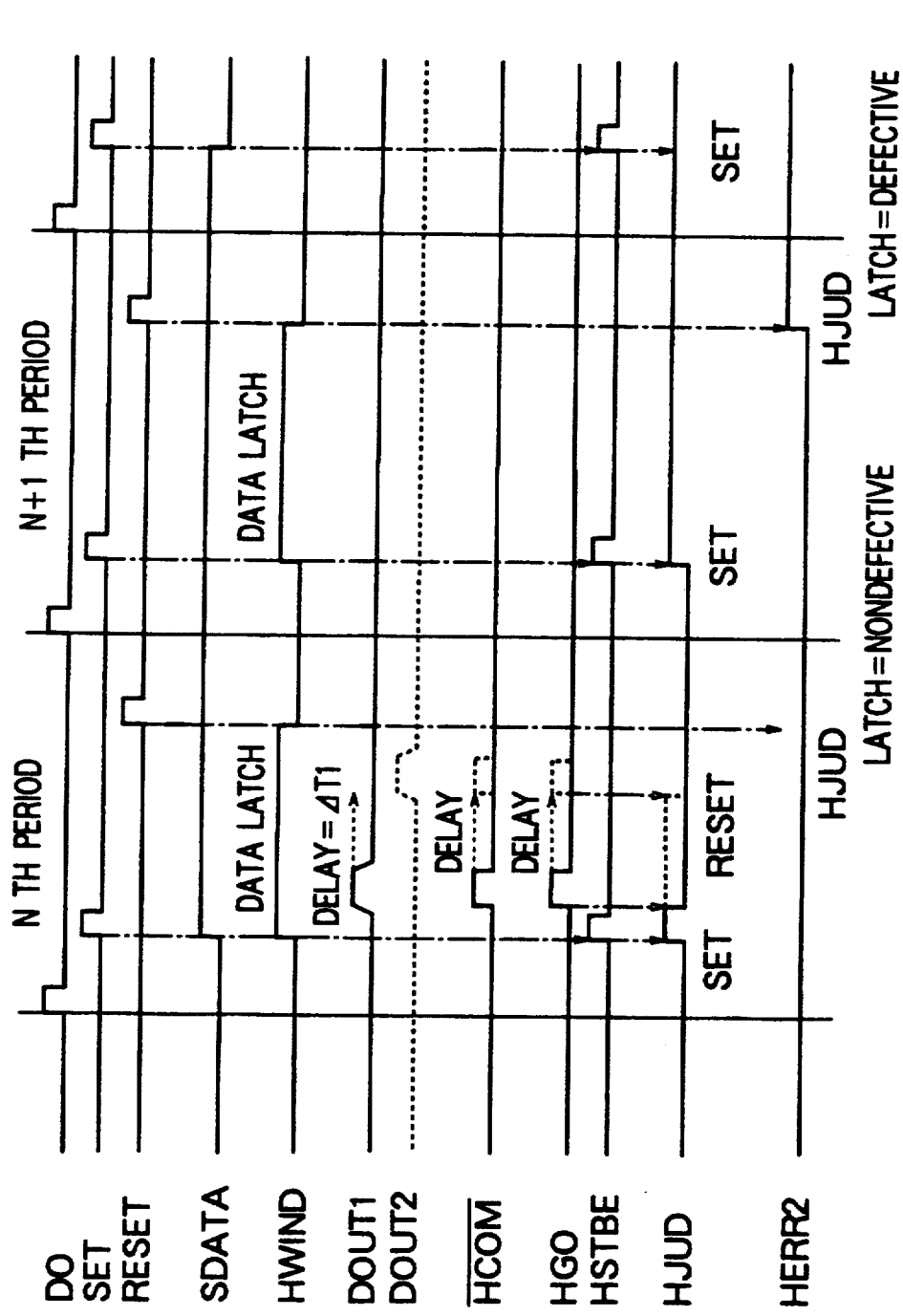
FIG. 4 is a timing chart of a high level discrimination operation performed with low voltage and according to an embodiment of the present invention.

A function test will now be described in which power supply voltage Vcc1, Vcc2 or Vcc3 is applied to the IC 9 to be tested. The potential differences among the power source voltage levels satisfy Vcc1 > Vcc2 > Vcc 3. When the potential of the power supply voltage applied to the IC to be tested has been changed from Vcc1 to Vcc2 as shown in FIG. 4, the electrical characteristics of the IC 9 at which the output voltage DOUT changes from DOUT 1 to DOUT 2. The discrimination circuit of the function testing apparatus according to the present invention is able to eliminate the necessity of changing the timing setting data for the SET generating circuit 2 and that for the RESET generating circuit 3 between the case where the function test is performed using the power supply voltage Vcc1 and the case where the test is performed using the power supply voltage Vcc2, and two function tests using the power supply voltage Vcc1 and the power supply voltage Vcc2 can be performed. The procedure will now be described. First, the electrical characteristics of the IC 9 are used to predict the reference output timing for DOUT 1 when the power supply voltage Vcc1 is applied and that for DOUT 2 when the power supply voltage Vcc2 is applied. The timing for the discrimination start timing signal SET must be set prior to the predicted output timing for the DOUT 1, and the timing for the discrimination completion timing signal RESET must be set to be after the predicted output timing for the predicted DOUT 2. When the discrimination circuit according to the present invention has performed the two types of the function tests in accordance with the foregoing operation procedure, the necessity of changing the date for setting the timing of the SET generating circuit 2 and data for setting the timing of the RESET generating circuit 3 can be eliminated while determining whether the DOUT 1 and the DOUT 2 are nondefective.

Figure 5:
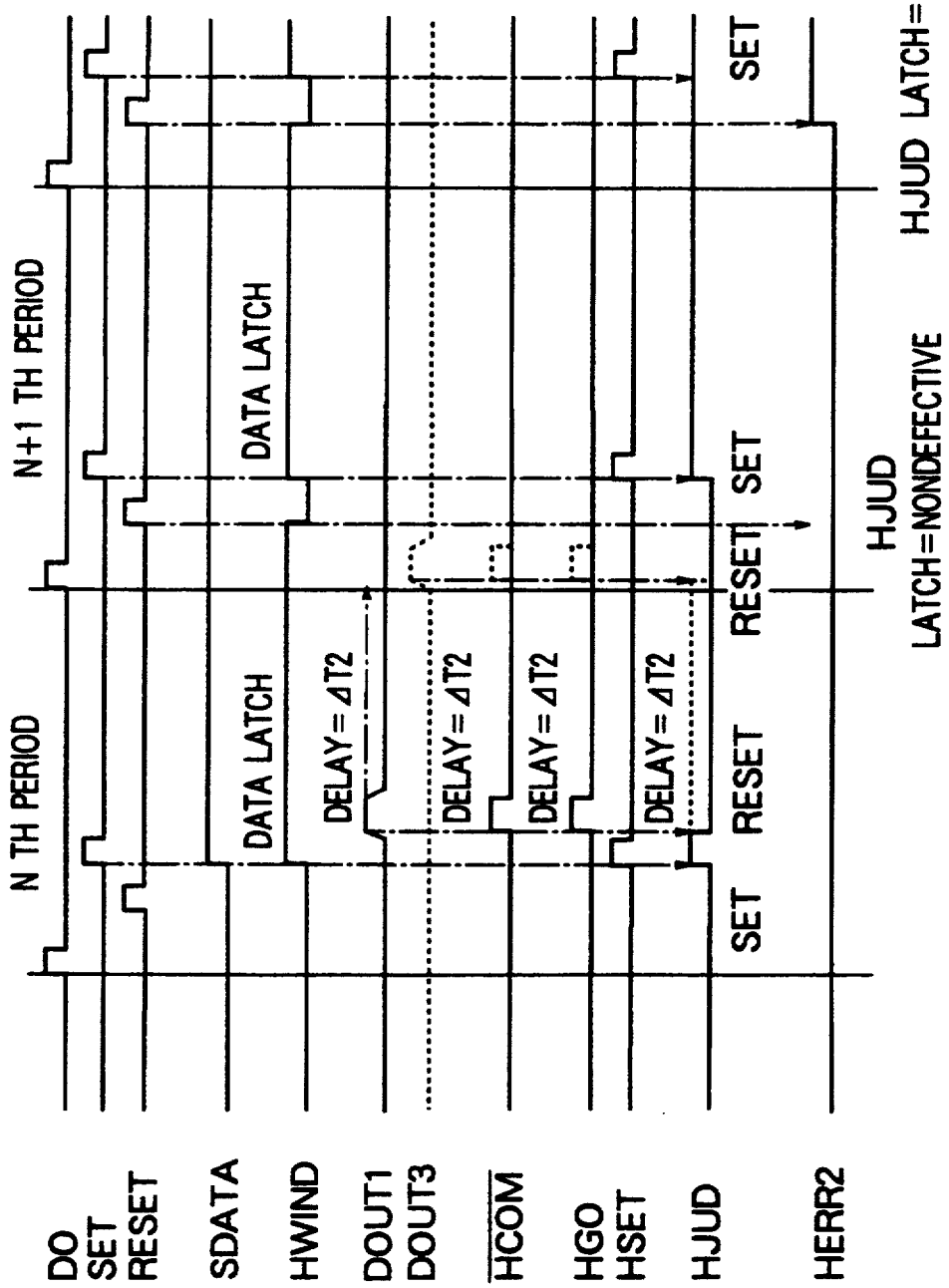
FIG. 5 is a timing chart of a high level discrimination operation performed with lower voltage according to an embodiment of the present invention.

When the power supply voltage has been further lowered to Vcc3, it can be considered that the output timing for the DOUT 3 is delayed for ΔT2 from the output timing for the DOUT 1 as shown in FIG. 5 and therefore the output timing for the DOUT 3 exceeds the period. In this case, setting of the timing of RESET to exceed the period enables the nondefective/defective discrimination region to be set to exceed two periods. That is, even if DOUT 1 is supplied at the N th period and DOUT 3 is supplied at the N+1th period, the function test performed by the discrimination circuit according to the present invention in accordance with the foregoing procedure can eliminate the necessity of changing the data for setting the timing of the SET generating circuit 2 and the data for setting the timing of the RESET generating circuit 3 while determining whether DOUT1 and DOUT 3 are nondefective.

As has been described above, the determination according to the present invention is arranged in such a manner that the timing signal SET supplied from the SET generating circuit 2 is used as the start point and the signal RESET supplied from the RESET generating circuit 3 is used as the end point and a nondefective IC determination is made if the discrimination time range from the start point to the end point includes a time region in which the output data from the IC 9 to be tested and the predicted voltage data in the apparatus for testing the functions of the IC 9 coincide with each other. Therefore, the necessity of changing the data for setting the timing of the SET generating circuit 2 and that of the RESET generating circuit 3 can be eliminated, regardless of whether the high voltage is applied to the power supply voltage Vcc of the IC 9 to be tested or the low voltage is applied to the Vcc to perform each function test. Even if the timing, at which the output voltage DOUT from the IC 9 to be tested is supplied exceeds the period the function test can be accurately performed while eliminating the necessity of changing the test pattern data for the timing.

What is claimed is:

1. An apparatus for testing the function of an integrated circuit (IC) comprising:
a test pin for electrically contacting an IC to be tested; and
a discrimination circuit for testing the function of the IC, said discrimination circuit comprising:
a first timing-signal generator for supplying a discrimination start timing signal as a start point of a discrimination time range;
a second timing-signal generator for supplying a discrimination completion timing signal as an end point of the discrimination time range;
a test pattern transmitter for storing and transmitting test pattern data in response to the discrimination start timing signal supplied from said first time-signal generator;
voltage comparison and discrimination means for comparing the output voltage from the IC to be tested with a predicted voltage data set in accordance with each of the test pattern data in the discrimination time range, and transmitting a nondefective discrimination signal indicating that the IC is not defective when the output voltage and the predicted voltage coincide in the discrimination time range, said voltage comparison and discrimination means including a high level comparative voltage generating circuit for generating high-level voltages, a low level comparative voltage generating circuit for generating low-level voltages, the predicted voltage data sets comprising the high-level and low-level voltages, respectively coupled to said high-level and low level comparative voltage generating circuits and said test pin, first and second comparator circuits for comparing the output voltages from the IC with the predicted voltage data set and for respectively outputting high-level comparative signals and low-level comparative signals in response, a first logic circuit for generating a logical product of (i) an output of said test pattern transmitter and the discrimination start timing signal and (ii) an output of said test pattern transmitter and the discrimination completion timing signal, and a second logic circuit for generating the nondefective signal in response to the outputs of said first logic circuit and of said first and second comparator circuits;
a discrimination signal transmitter for transmitting a discrimination signal that starts at the start point and ends upon output of the nondefective discrimination signal transmitted from said voltage comparison and discrimination means in accordance with each of the test pattern data, said discrimination signal transmitter including a third logic circuit for generating respective logical products of the discrimination start timing signal and an output of said test pattern transmitter, and a fourth logic circuit for storing and gating the logical product from said third logic circuit and for transmitting the discrimination signal; and discrimination information transmitting means for transmitting a nondefective/defective signal indicating whether the IC is nondefective by latching the discrimination signal upon generation of the discrimination complete timing signal corresponding to the end point of the discrimination time range, a nondefective indication being given when the discrimination time range includes transmission of the nondefective discrimination signal, said discrimination information transmitting means including a fifth logic circuit for storing and gating the discrimination signal from said discrimination signal transmitter, and first and second latch circuits for latching the nondefective/defective signal output from the fifth logic circuit.

2. The apparatus of claim 1 wherein said first logic circuit includes a flip flop coupled to said first timing signal generator and said second timing signal generator and first and second AND gates coupled to said flip flop and said test pattern transmitter.

3. The apparatus of claim 2 wherein said second logic circuit includes third and fourth AND gates respectively coupled to receive outputs from said first and second AND gates and respectively coupled to said first and second comparator circuits.

4. The apparatus of claim 1 wherein said third logic circuit includes fifth and sixth AND gates respectively coupled to receive outputs from said first timing signal generator and from said test pattern transmitter.

5. The apparatus of claim 4 wherein said fourth logic circuit includes fifth and sixth flip flops respectively connected to receive outputs from said first and second AND gates and said third and fourth AND gates.

6. The apparatus of claim 5 wherein said fifth logic circuit includes third and fourth flip-flops respectively connected to receive outputs from said first and second flip-flops and said second timing signal generator.

* * * * *